US007167023B1

(12) United States Patent
Pan et al.

(10) Patent No.: US 7,167,023 B1
(45) Date of Patent: *Jan. 23, 2007

(54) MULTIPLE DATA RATE INTERFACE ARCHITECTURE

(75) Inventors: Philip Pan, Fremont, CA (US);
Chiakang Sung, Milpitas, CA (US);
Joseph Huang, San Jose, CA (US);
Yan Chong, Mountain View, CA (US);
Bonnie I. Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/059,299

(22) Filed: Feb. 15, 2005

Related U.S. Application Data

(63) Continuation of application No. 10/623,394, filed on Jul. 18, 2003, now Pat. No. 6,946,872, which is a continuation of application No. 10/038,737, filed on Jan. 2, 2002, now Pat. No. 6,806,733.

(60) Provisional application No. 60/315,879, filed on Aug. 29, 2001.

(51) Int. Cl.
*H01L 25/00* (2006.01)
*H03K 19/177* (2006.01)

(52) U.S. Cl. ............................. 326/41; 326/37; 326/47

(58) Field of Classification Search ............. 326/37–41, 326/47, 82
See application file for complete search history.

(56) References Cited

U.S. PATENT DOCUMENTS

| 5,223,755 A | 6/1993 | Richley |
| 5,555,214 A | 9/1996 | Sung et al. |
| 5,633,830 A | 5/1997 | Sung et al. |
| 5,764,080 A | 6/1998 | Huang et al. |
| 5,802,540 A | 9/1998 | Sung et al. |
| 5,828,229 A | 10/1998 | Cliff et al. |
| 5,970,255 A | 10/1999 | Tran et al. |
| 5,978,281 A | 11/1999 | Anand et al. |
| 6,002,282 A | 12/1999 | Alfke |
| 6,011,744 A | 1/2000 | Sample et al. |
| 6,023,175 A | 2/2000 | Nunomiya et al. |
| 6,044,122 A | 3/2000 | Ellersick et al. |
| 6,049,255 A | 4/2000 | Hagberg et al. |
| 6,061,292 A | 5/2000 | Su et al. |
| 6,100,713 A | 8/2000 | Kalb et al. |
| 6,128,692 A | 10/2000 | Sung et al. |
| 6,140,854 A | 10/2000 | Coddington et al. |
| 6,147,520 A | 11/2000 | Kothandaraman et al. |

(Continued)

OTHER PUBLICATIONS

U.S. Appl. No. 10/037,861, filed Jan. 2, 2002, Chong et al.

(Continued)

*Primary Examiner*—Anh Q. Tran
(74) *Attorney, Agent, or Firm*—Townsend and Townsend and Crew LLP

(57) ABSTRACT

Method and circuitry for implementing high speed multiple-data-rate interface architectures for programmable logic devices. The invention partitions I/O pins and their corresponding registers into independent multiple-data rate I/O modules each having at least one pin dedicated to the strobe signal DQS and others to DQ data signals. The modular architecture facilitates pin migration from one generation of PLDs to the next larger generation.

47 Claims, 6 Drawing Sheets

U.S. PATENT DOCUMENTS

| | | |
|---|---|---|
| 6,150,863 A | 11/2000 | Conn et al. |
| 6,157,690 A | 12/2000 | Yoneda |
| 6,178,212 B1 | 1/2001 | Akashi |
| 6,212,113 B1 | 4/2001 | Maeda |
| 6,212,127 B1 | 4/2001 | Funaba et al. |
| 6,218,858 B1 | 4/2001 | Menon et al. |
| 6,236,231 B1 | 5/2001 | Nguyen et al. |
| 6,252,419 B1 | 6/2001 | Sung et al. |
| 6,269,051 B1 | 7/2001 | Funaba et al. |
| 6,279,073 B1 | 8/2001 | McCracken et al. |
| 6,295,245 B1 | 9/2001 | Tomita et al. |
| 6,316,980 B1 | 11/2001 | Vogt et al. |
| 6,342,796 B2 | 1/2002 | Jung |
| 6,346,843 B2 | 2/2002 | Takahashi |
| 6,351,165 B1 | 2/2002 | Gregorian et al. |
| 6,351,166 B2 | 2/2002 | Hashimoto |
| 6,356,509 B1 | 3/2002 | Abdel-Hafeez et al. |
| 6,400,197 B2 | 6/2002 | Lai et al. |
| 6,442,102 B1 | 8/2002 | Borkenhagen et al. |
| 6,445,642 B2 | 9/2002 | Murakami |
| 6,466,491 B2 | 10/2002 | Yanagawa |
| 6,472,904 B2 | 10/2002 | Andrews et al. |
| 6,492,852 B2 | 12/2002 | Fiscus |
| 6,504,790 B1 | 1/2003 | Wolford |
| 6,509,776 B2 | 1/2003 | Kobayashi et al. |
| 6,525,565 B2 | 2/2003 | Young et al. |
| 6,525,585 B1 | 2/2003 | Lida et al. |
| 6,570,944 B2 | 5/2003 | Best et al. |
| 6,577,694 B1 | 6/2003 | Meghelli |
| 6,690,201 B1 | 2/2004 | Simking et al. |
| 6,798,241 B1 | 9/2004 | Bauer et al. |
| 6,816,991 B2 | 11/2004 | Sanghani |
| 6,825,698 B2 | 11/2004 | Wang et al. |
| 6,864,710 B1 * | 3/2005 | Lacey et al. .................. 326/39 |
| 6,864,715 B1 | 3/2005 | Bauer et al. |
| 6,940,768 B2 | 9/2005 | Dahlberg et al. |
| 6,946,872 B1 * | 9/2005 | Pan et al. ..................... 326/41 |
| 2004/0000940 A1 | 1/2004 | Chang |
| 2005/0025190 A1 | 2/2005 | Frisch |

OTHER PUBLICATIONS

U.S. Appl. No. 10/799,408, filed Mar. 12, 2004, Chong et al.
U.S. Appl. No. 10/799,409, filed Mar. 12, 2004, Johnson.

* cited by examiner

MULTIPLE DATA RATE INTERFACE ARCHITECTURE

CROSS-REFERENCES TO RELATED APPLICATIONS

This application is related to commonly-assigned, co-pending U.S. patent application Ser. No. 10/037,861, filed Jan. 2, 2002 entitled "Self-Compensating Delay Chain for Multiple Data-Rate Interfaces," by Chong et al., which is hereby incorporated by reference in its entirety.

BACKGROUND OF THE INVENTION

The present invention relates in general to input/output (I/O) interface in integrated circuits, and in particular to method and circuitry for distributing clock signals in a programmable logic device (PLD) that employs a multiple data rate interface.

To address the data bandwidth bottleneck in the interface between integrated circuits, high speed interface mechanisms have been developed which have helped increase the speed of data transfer and data throughput. In a multiple data rate interface scheme, two or more bits of data are transferred during each clock period. One example of multiple data rate is the so called double data rate, or DDR, technology, which performs two data operations in one clock cycle and achieves twice the throughput of data. This technology has enhanced the bandwidth performance of integrated circuits used in a wide array of applications from computers to communication systems. The DDR technique is being employed in, for example, today's synchronous dynamic random access memory (SDRAM) circuits.

The basic DDR implementation processes I/O data (also referred to as DQ signals) using both the rising edge and the falling edge of a clock signal DQS that functions as a data strobe to control the timing of data transfer. FIG. 1 shows the timing relationship between DQS and DQ signals. DQS is normally edge-aligned with DQ for a DDR interface operating in read mode (i.e., when receiving data at the I/Os). For optimum sampling of the data, internal to the integrated circuit, DQS is delayed by ¼ of the clock period to achieve a 90 degree phase shift between the edges of DQ and DQS. This ensures that the DQS edge occurs as close to the center of the DQ pulse as possible as shown in FIG. 1. It is desirable to implement this 90 degree phase shift as accurately and in as stable a manner as possible. However, typical phase shift techniques that use, for example, delay chains, are highly susceptible to process, voltage, and temperature (PVT) variations. In addition, typical DDR timing specifications require a wide frequency range of operation from, e.g., 133 MHz to 200 MHz. This places further demands on the performance of the phase shift circuitry. Another factor that affects DQS strobe timing is the skew between DQS and DQ. In general, for improved timing accuracy it is desirable to minimize this skew as much as possible.

The programmable logic technology has also seen an increased demand for this type of multiple data rate interface. Some of the above constraints, however, are exacerbated when implementing a DDR interface in a PLD. In a typical PLD configuration, the DQS signal is first applied to a phase locked loop (PLL) to generate the required phase shift and alignment. The DQ signals are applied directly to respective I/O registers whose clock inputs receive the phase-corrected DQS signal. There are inherent delays in the routing of the DQS signal from the DQS pin to the PLL and then to the I/O registers, where the I/O registers can be very large in numbers located at varying distances. These delays contribute to the undesirable skew between DQS and DQ. Also, the same PLD may be configured to operate at any frequency in the DDR frequency range and thus must accommodate the various clock speeds. Yet another concern is the ever aggressive increase in density and number of I/Os that is typical of the PLD technology as it moves from one generation to the next. To speed up the time-to-market cycles for future PLDs, it is desirable to devise an interface architecture that facilitates pin migration from one product family to the next.

BRIEF SUMMARY OF THE INVENTION

The present invention provides method and circuitry for implementing high speed multiple-data-rate interface architectures for programmable logic devices. In one embodiment, the invention employs a delay chain with precise phase shift control to achieve the desired phase shift in the data strobe DQS signal. I/O pins and their corresponding registers are divided into groups, with each group having at least one pin dedicated to the DQS signal and others to data (DQ) signals. An incoming DQS signal goes through the desired phase shift (e.g., 90 degrees) controlled by the phase shift control circuit, and drives a local clock interconnect line that connects to the I/O registers within the group. To facilitate efficient pin migration, in one embodiment, the invention partitions banks of I/O cells into smaller sections or groups. Each I/O section forms an independent multiple-data-rate I/O interface unit or module with dedicated DQS resources (pin, phase delay and clock line). Each module is designed such that as the number of I/O cells increases from one generation device to the next, the module can easily be scaled in size to facilitate the implementation of larger PLDs.

Accordingly, in one embodiment, the present invention provides a programmable logic device (PLD) including input/output (I/O) interface having a first plurality of I/O registers, the first plurality of I/O registers being partitioned into a second plurality of I/O sections each I/O section having N data I/O registers and a strobe circuit configured to drive a local clock line coupled to clock inputs of the N data I/O registers, the N data I/O registers and the strobe circuit in each I/O section being coupled to a corresponding number of device pins; and programmable logic circuitry coupled to the I/O interface. The strobe circuit in each I/O section is configured to programmably shift a phase of an input strobe signal. The PLD further includes a master phase control circuit coupled to receive a system clock signal and configured to generate a phase control signal that controls the amount of phase delay in the strobe circuits in the second plurality of I/O sections.

In another embodiment, the present invention provides a computing system including a multiple-data rate memory circuit coupled to a programmable logic device (PLD) via an interconnect bus, wherein the PLD is of the type described above.

In yet another embodiment, the present invention provides a method of operating a PLD including receiving N groups of data bits each group having M data signals and a corresponding data strobe signal; partitioning I/O register blocks inside the PLD into a corresponding N I/O modules, each module having M I/O register blocks and a strobe circuit coupled to receive a respective group of M data signals and data strobe signal; driving clock inputs of the M I/O register blocks in each of the N I/O modules using an independent clock network that is local to each of the N I/O modules.

The following detailed description and the accompanying drawings provide a better understanding of the nature and advantages of the programmable logic device according to the present invention.

DETAILED DESCRIPTION OF THE INVENTION

Figure 1:
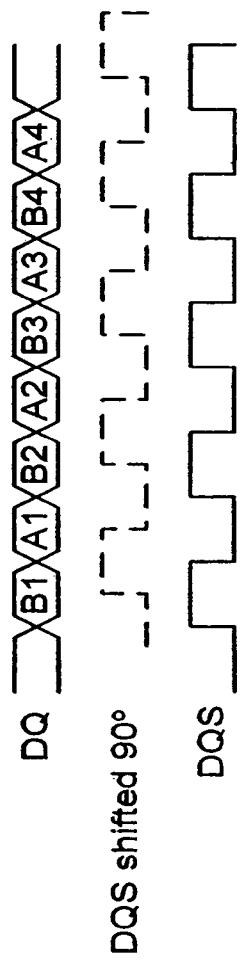
FIG. 1 is a timing diagram illustrating the relationship between data DQ and data strobe signal DQS in a double-data rate operation.
Figure 2:
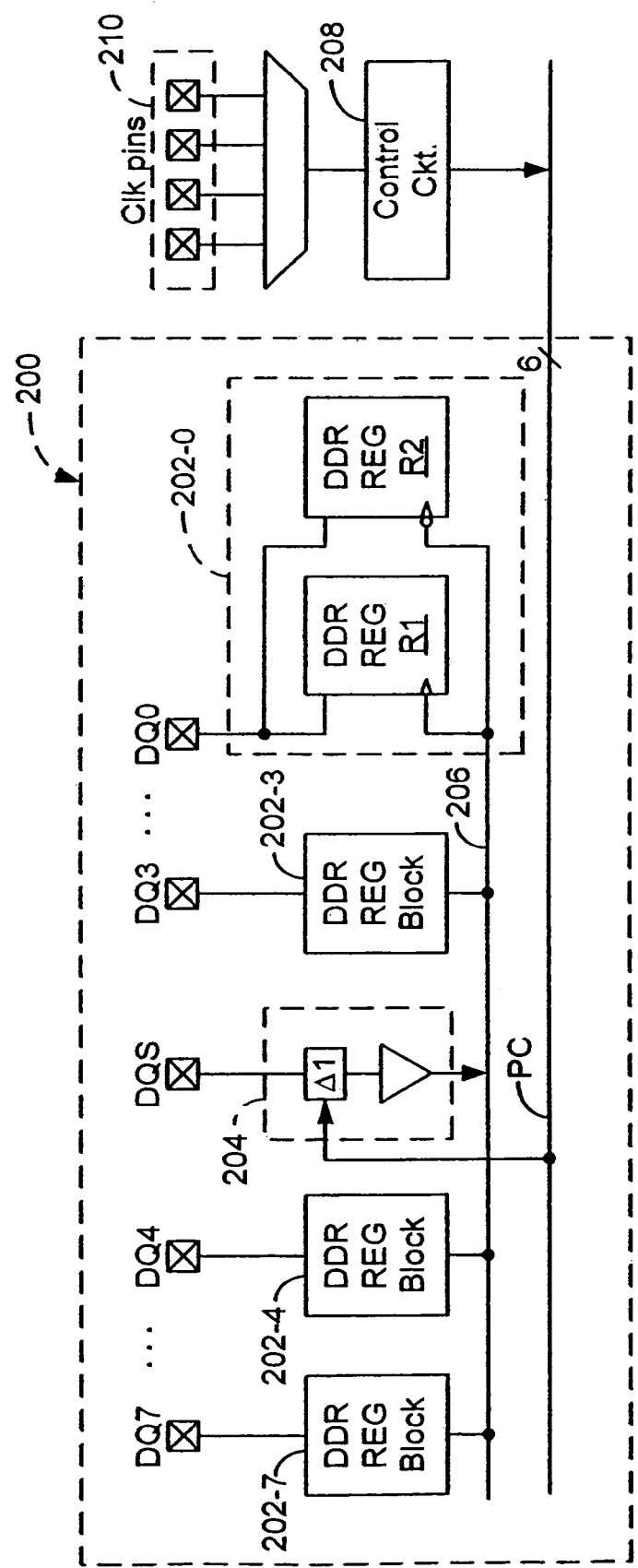
FIG. 2 is a block diagram of an exemplary I/O module for a PLD configured for double-data-rate operation according to one embodiment of the present invention.

To minimize skew, accommodate a wide frequency range of operation, and facilitate rapid pin migration to larger PLDs, the present invention provides a modular multiple-data-rate I/O architecture that can be readily replicated and scaled. For illustrative purposes, the invention is described in the context of a double-data rate (DDR) system. It is to be understood, however, that the principles of this invention can be applied to systems operating at quad-data rate or higher. Referring to FIG. 2, there is shown a block diagram of an I/O module 200 for a PLD configured for DDR operation according to one embodiment of the present invention. In this embodiment, DDR interface module 200 includes a number of, in this example eight, data I/O cells each having a data I/O pin DQ and a DDR register block 202 made up of a pair of data registers R1 and R2. Module 200 also includes a strobe input cell which is preferably located at a central location vis à vis other I/O cells, and includes a strobe signal pin DQS and phase delay circuit 204. Phase delay circuit 204 causes a 90 degree phase shift in the input strobe signal DQS and applies the phase shifted strobe signal to the module clock net 206 that is a local clock line dedicated to the I/O cells inside module 200. Local clock net 206 has programmable connection to drive all input registers of register blocks 202 in the DDR interface group. Thus, this DDR clock scheme allows for maintaining the clock skew between DQ and DQS to remain within a controllable range. The overall PLD I/O architecture includes multiple modules 200 each of which has its own DQS resources (DQS pin, phase shift circuit 204, and local clock net 206).

Figure 7:
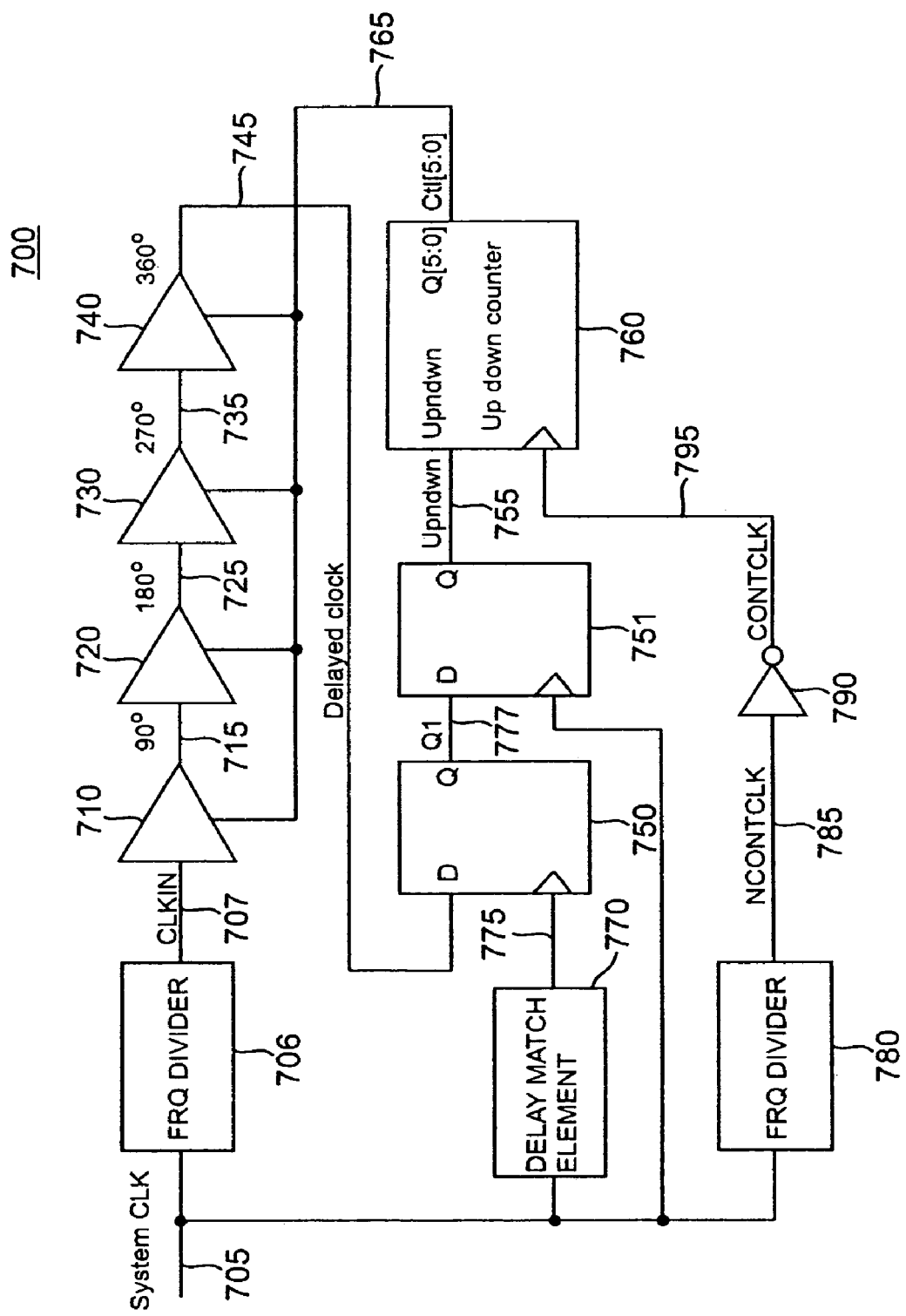
FIG. 7 shows an exemplary implementation for a phase control circuit according to an embodiment of the present invention.

Phase shift circuit 204 is a programmably controlled delay chain that adjusts its delay in response to phase control signal PC. Phase control signal PC is a multi-bit (e.g., 6 bit) binary signal that is supplied by a master phase control circuit 208. Master phase control circuit 208 operates in response to a system clock arriving at any one of multiple clock pins 210, and is shared by a number of modules 200. In one embodiment, master phase control circuit 208 is a delay-locked loop (DLL) that takes into account the PLD operating frequency, PVT variations as well as contributions by other potential sources of delay to generate control signal PC to achieve the desired 90 degree phase shift locally in the various DDR I/O modules 200. Various embodiments for master control circuit 208 and phase shift circuit 204 are described in greater detail in the above-referenced commonly-assigned, co-pending patent application Ser. No. 10/037,861, filed Jan. 12, 2002 entitled "Self-Compensating Delay Chain for Multiple Data-Rate Interfaces," by Chong et al. One example for an implementation of the control circuit 208 is shown in FIG. 7. Referring to FIG. 7, control circuit 700 includes frequency dividers 706 and 780, variable-delay buffers 710, 720, 730, and 740, phase detector 750, flip-flop 751, up/down counter 760, and inverter 790. The up/down counter may be a binarily-weighted, thermal, or other type of up/down counter, such as a combination binarily-weighted and thermal counter. In a specific embodiment, the counter is binarily weighted.

A system clock signal on line 705 is received by frequency divider 706. Frequency divider 706 divides the system clock signal's frequency, thereby generating the CLKIN signal on line 707. In a specific embodiment, frequency divider 706 divides the system clock frequency by 8. Alternately, other frequency divisions are possible, such a divide by 4, 16, or other value. The lower frequency CLKIN signal on line 707 is delayed by variable-delay buffers 710, 720, 730, and 740. A delayed clock signal on line 745 is provided to phase detector 750. Delay match element 770 is designed to match the delay in the frequency divider 706, and provide an output signal on line 775 to the phase detector 750. The phase detector 750 determines the phase relationship between the system clock and the delayed clock, for example, whether a rising edge of the system clock precedes a rising edge of the delayed clock. Alternately, the phase detector may determine whether a falling edge of the system clock precedes a falling edge of the delayed clock.

In a specific embodiment, phase detector 750 does this by determining the level of the delayed clock signal on line 745 at the rising edges of the clock signal on line 775. This level detection results in output signal Q1 on line 777, which is input to flip-flop 751. Flip-flop 751 is clocked by the system clock on line 705 and provides the up/down signal 755 to the up/down counter 760. A second frequency divider 780 divides the system clock's frequency, thus generating signal NCONTCLK on line 785. Again, in a specific embodiment of the present invention, frequency divider 780 divides the system clock frequency by eight. In other embodiments, this divisor may be different, such as 4, 16, or other appropriate value. The NCONTCLK signal on line 785 is inverted by inverter 790, resulting in a CONTCLK signal on line 795. The CONTCLK signal on line 795 clocks the up/down signal on line 755 into the up/down counter, resulting in the output signal Ct on bus 765.

Again, when the output of up/down counter 760 changes, the delays through the variable-delay buffers 710 through 740 change. But this change in delay is not instantaneous, and takes a finite duration to reach a final value. In a specific embodiment, frequency dividers 706 and 780 are separate frequency dividers such that their output edges may be timed to give the variable-delay buffers 710 through 740 a maximum duration in which to settle. In other embodiments, frequency dividers 706 and 780 may be the same frequency divider.

Again, the delay match element 770 is designed to match the delay between a system clock rising edge and a CLKIN rising edge on lines 705 and 707. Matching these delays enables the phase detector 750 to adjust the delay of the variable-delay buffers 710 through 740 with a minimum amount of systematic delay errors.

The variable-delay buffers 710 through 740 match or are similar to the variable-delay buffer 204 in FIG. 2. The cumulative delay provided by variable-delay buffers 710–740 is one clock cycle or 360 degrees. In a double-data-rate interface the delay of the variable-delay buffer 204 in FIG. 2 is one-fourth the cumulative delay of the variable-delay buffers 710 through 740, or one-quarter of a clock cycle or 90 degrees. In other multiple-data-rate interfaces the phase shift may be different, and there may be more variable-delay buffers like 204 in FIG. 2 providing different delays. For example, delays of 60 and 120, or 45, 90, and 135 degrees may be provided by multiple variable-delay buffers connected in series or parallel. These delays can be used in triple and quadruple-data-rate interfaces, respectively. Alternately, they may be used in other data-rate interfaces.

In other embodiments, the system clock and DQS signal may be harmonics or have frequencies that are multiple of each other. For example, the DQS signal may be the second harmonic, or have twice the frequency of the system clock. In that case, a delay of one system clock cycle in the divided system clock signal CLKIN corresponds to a two cycle delay in the DQS signal. Accordingly, eight elements may be used in the system clock delay path, while one matching element is used in the DQS path.

One skilled in the relevant art appreciates that this block diagram may be drawn differently without deviating from the scope of the present invention. For example, the phase detector 750 and flip-flop 751 may be considered as a single phase detector block. Also, the flip-flop 751 may be considered as a block inside the up/down counter 760. Further, the variable-delay buffers 710 through 740 may be in front of the frequency divider 706, or some of the variable-delay buffers 710 through 740 may be in front of the frequency divider 706, while the remainder follow it.

Referring back to FIG. 2, it is to be understood that module 200 is a specific example described herein for illustrative purposes only. Many different variations and alternatives are possible. For example, the number of I/O cells in each module 200 may vary depending on the application. In some embodiments, a module 200 may include non-DDR I/O registers. That is, a DDR interface module 200 may include, for example, eight DDR register blocks 202 plus several additional general-purpose I/O registers to add further flexibility. In a variation of this embodiment where all I/O cells and the strobe input cell are designed identically, any eight cells within the module can be selected to be DDR DQ cells, while the cell that is as close to the center as possible would be selected as the DQS cell. In this embodiment, the DQS cells that include data registers can be used as other normal data registers in non-DDR applications. In such an embodiment, the DQS cell can be programmably configured to have the DQS pin connect to phase shift circuit 204 (in case of a DDR application), or alternatively to normal I/O registers (in case of non-DDR application). In applications with higher data rates (e.g., quad data rate), module 200 may include more than one DQS cell, and DDR register blocks 202 may include more than two (e.g., four) registers.

Figure 3:
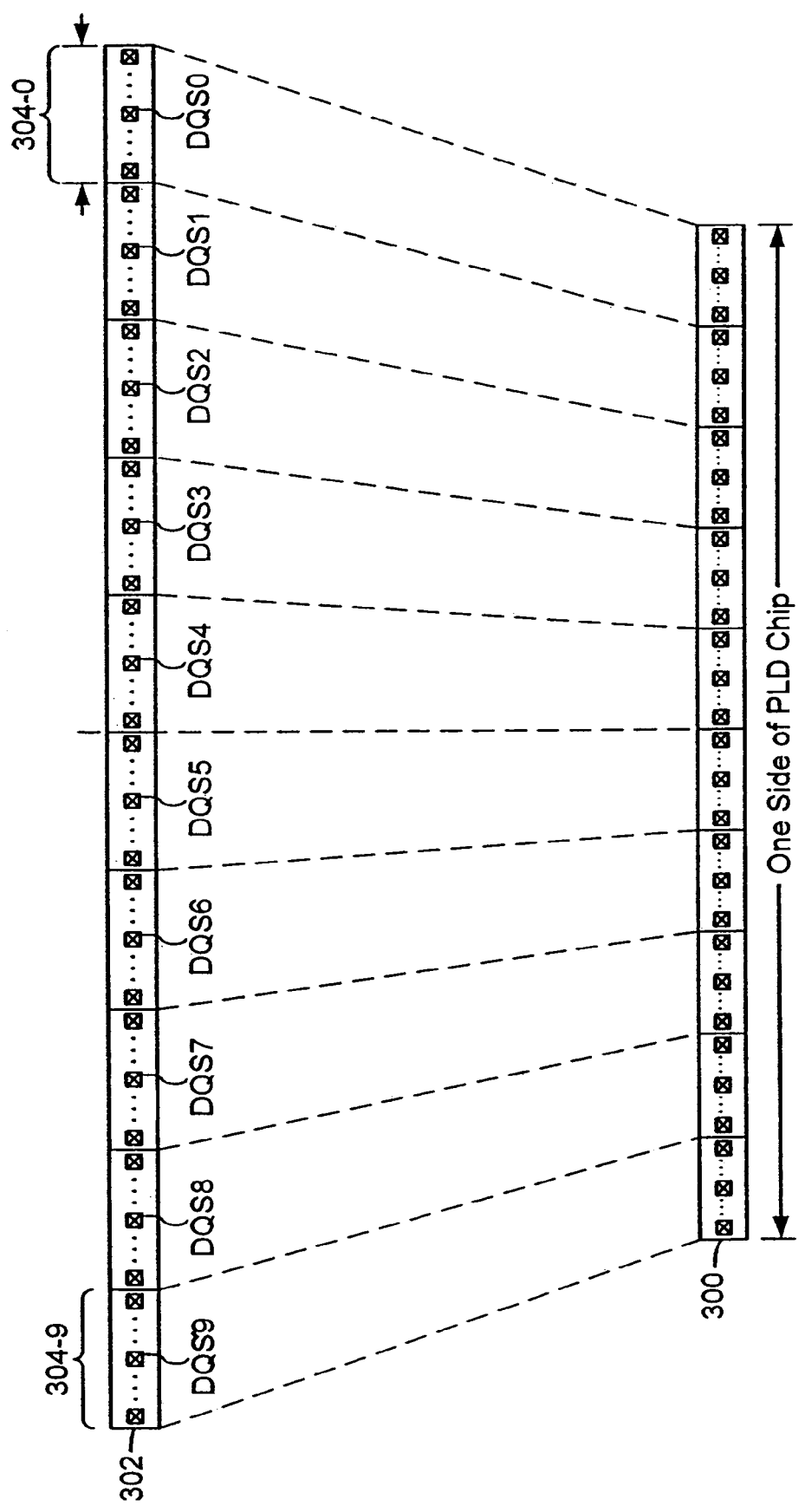
FIG. 3 is a simplified diagram illustrating an I/O architecture along one edge of a PLD according to an exemplary embodiment of the invention.

Another advantage of the multiple-data-rate interface architecture for a PLD according to the present invention is that it allows the I/O structure to be easily scaled to a higher pin count for larger PLDs. FIG. 3 shows the I/O bank along one edge of a PLD die for two devices, 300 and 302. In this example, PLD 300 represents the smallest device in a PLD product family and PLD 302 is the largest. Both I/O banks of PLD 300 and PLD 302 are partitioned into a fixed number, e.g., 10, of DDR I/O sections 304-0 to 304-9. An exemplary embodiment for the internal resources of a DDR I/O section 304 is shown in FIG. 2. In any given PLD, each I/O section 304 includes the same number of I/O cells, e.g., 10, while for different PLDs this number will vary up to, e.g., 35. Regardless of the size of the PLD, however, each DDR I/O section 304 forms a single DDR interface module with independent DQS resources. That is, each DDR I/O section 304, whether in the smallest device in the family or the largest, includes at least one DQS pin and its associated circuitry, multiple, e.g., eight DQ pins and DQ registers, and one local clock net as shown, for example, in FIG. 2. Once again, those skilled in the art will appreciate that the I/O bank according to the present invention need not necessarily include 10 DDR I/O sections 304, and may instead include fewer or larger number of sections.

The flexibility afforded by the I/O architecture of the present invention speeds up the time-to-market cycle for new and larger PLDs. When designing a next generation PLD, because of the uncertainty regarding the eventual die size as well as the package hardware restrictions, the designer is unable to decide on the location of DQ and DQS pins until the end of the design cycle. This adds further delays to the design cycle. The present invention essentially eliminates this delay by providing a modular I/O architecture that can be easily scaled such that the boundaries of each I/O section can still be defined at an early design stage. According to one embodiment of the invention, the DDR I/O section may have a number of I/O registers that is larger than the minimum (e.g., 8) required for a particular multiple-data-rate (e.g., DDR) system. With pre-defined boundaries, however, the sections can be placed while final DQS locations can be decided at a later time from one of multiple possible pins in the DDR I/O section followed by the DQ and local clock net.

Figure 4:
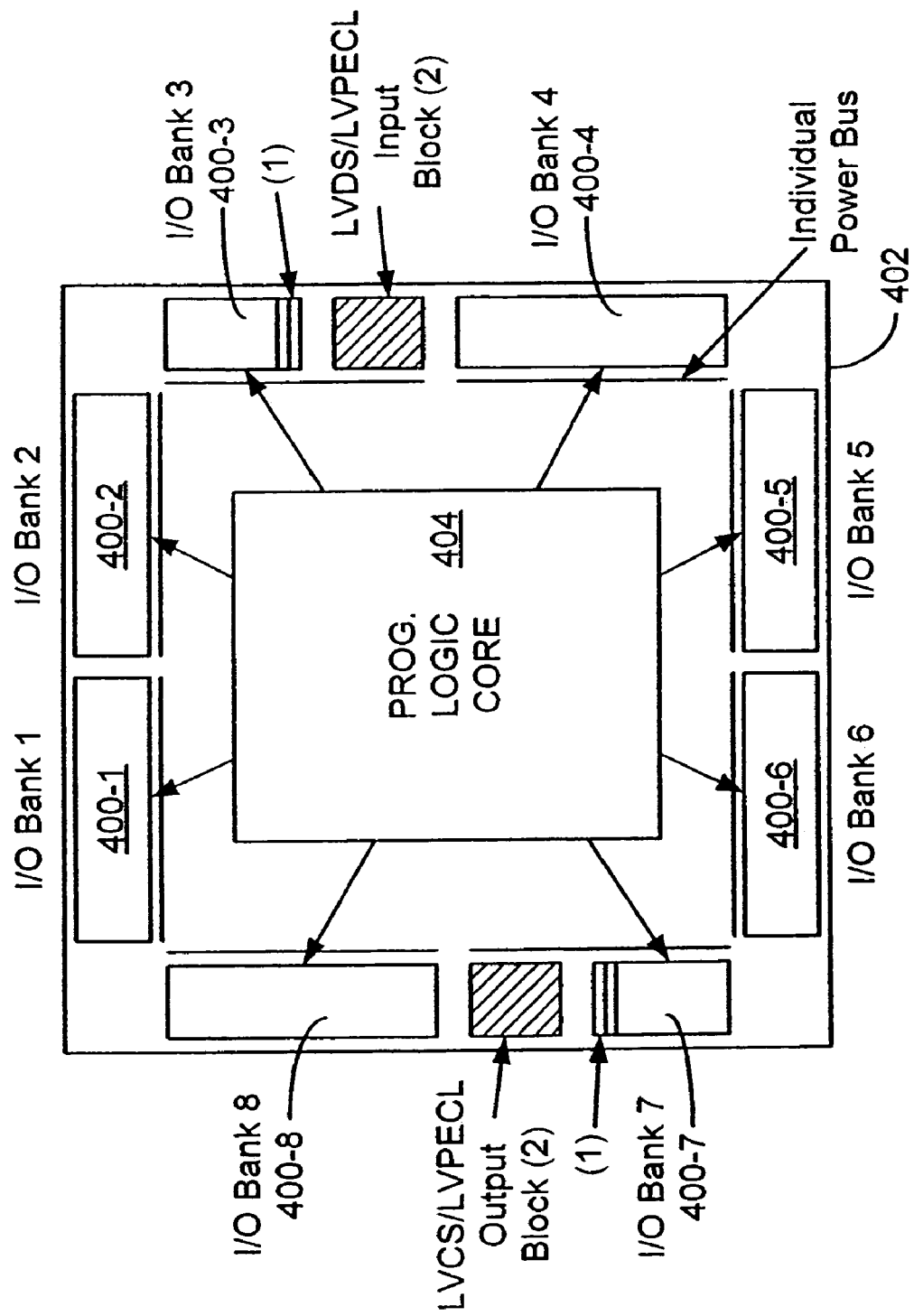
FIG. 4 shows an exemplary layout architecture for a PLD according to the present invention.
Figure 5:
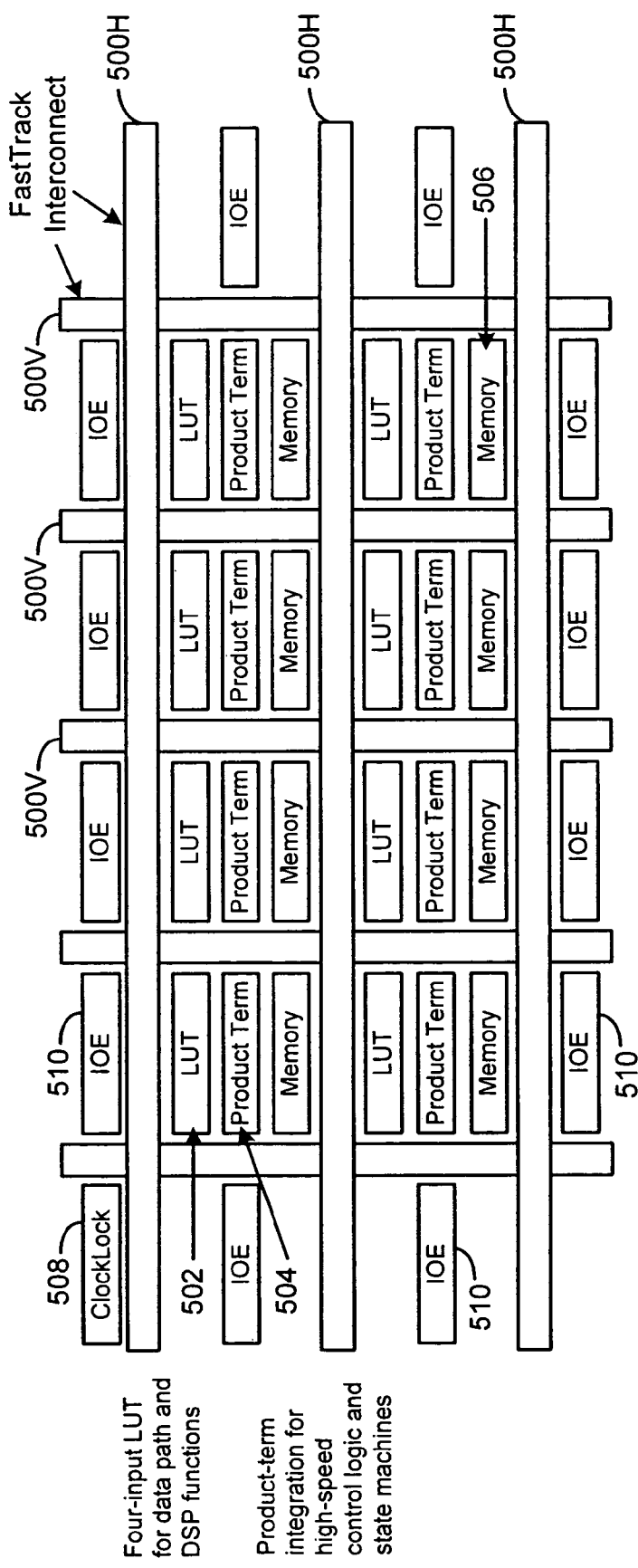
FIG. 5 is a block diagram of the internal circuitry of a PLD according to an exemplary embodiment of the present invention.

The exemplary I/O banks depicted in FIG. 3 show those along one edge of a PLD die. The modular nature of the I/O architecture of the present invention allows for many different variations in how the I/O banks are employed. Referring to FIG. 4, there is shown one example of a PLD simplified layout architecture. In this example, eight I/O banks 400 are placed in pairs along each edge of PLD die 402. Each bank 400 may be similar to the one shown in FIG. 3. I/O banks 400 connect to programmable logic core 404. Depending on the particular implementation, the PLD may include multiple master phase control circuits (208 in FIG. 2) that are shared by various combination of banks. For example, one master phase control circuit maybe used per bank to drive the DQS phase shift circuitry in each DDR I/O section within that bank. For the embodiment shown in FIG. 4, that would result in eight master phase control circuits. Alternatively, a pair of banks along each edge of the die could share one master phase control circuit. Programmable core logic 404 may be implemented using a variety of different architectures. One example of PLD core logic architecture is shown partially in FIG. 5. The PLD according to this example includes a network of fast track interconnect lines 500H and 500V that provide programmable interconnection between logic and memory resources that are arranged in blocks defined by the interconnect lines. These blocks may include look-up table (LUT) logic 502 for data path and digital signal processing functions, product term logic 504 for high-speed control logic and state machines, as well as memory 506. Other peripheral circuitry such as clock management circuit and I/O drivers 510 may also be included. A more detailed description of a PLD of the type shown in FIG. 5 can be found in data books published by Altera Corporation, and in particular the APEX II PLD family, which is hereby incorporated by reference. It is to be understood, however, that the invention is not limited to a particular type of PLD architecture and that the modular multiple-data-rate I/O architecture of the present invention can be utilized in any type of programmable logic device, many variations of which are described in Altera Corporation data books.

Figure 6:
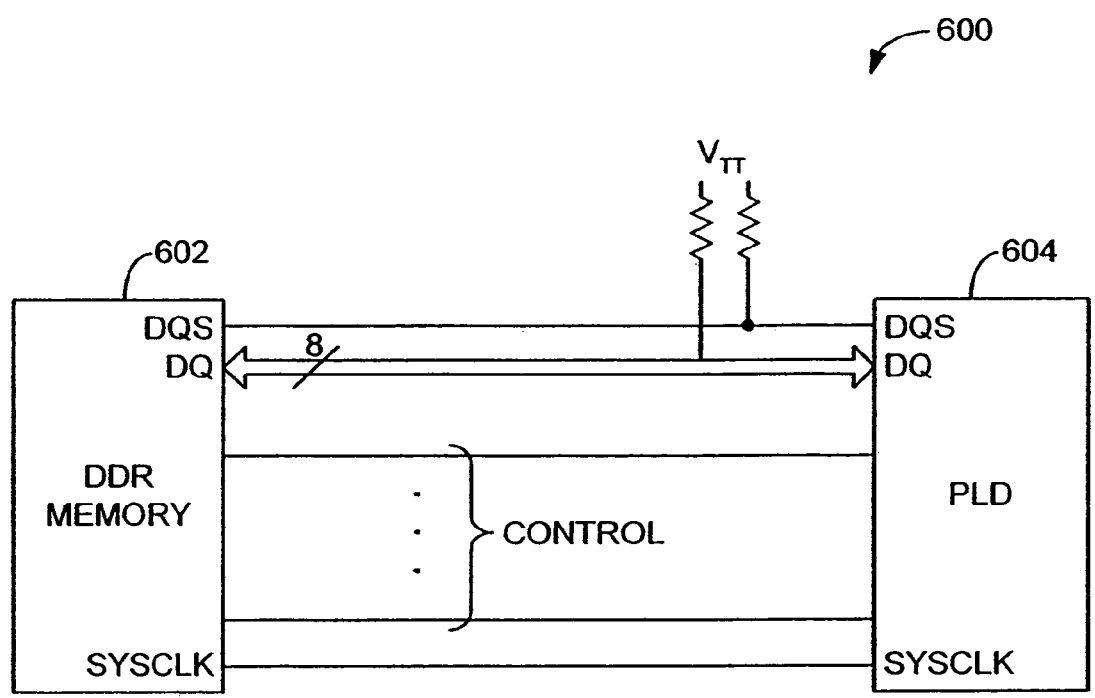
FIG. 6 is a block diagram of an exemplary computing system that employs a multiple-data-rate PLD according to an embodiment of the present invention.

FIG. 6 is a block diagram of a computing system 600 that includes a multiple-data rate memory device 602 connected to a PLD 604 according to the present invention. In this example, memory device 602 may be a double-data rate synchronous dynamic random access memory (DDR SDRAM) device that bundles, e.g., eight DQ data lines with each DQS strobe line. The interconnect between memory device 602 and PLD 604 may include multiple sets of DQ/DQS lines. Memory device 602 also supplies a system clock SYSCLK to PLD 604 in addition to other control signals. PLD 604 is designed with the modular DDR I/O interface as described above. PLD 604 may be configured to perform any user-defined functionality such as a microprocessor, digital signal processor, network processor, or the like.

In conclusion, the present invention provides method and circuitry for implementing high speed multiple-data-rate interface architectures for programmable logic devices. The invention partitions I/O pins and their corresponding registers into independent multiple-data rate I/O modules each having at least one pin dedicated to the DQS signal and others to DQ data signals. The modular architecture facilitates pin migration from one generation of PLDs to the next larger generation. While the above provides detailed description of specific embodiments, it is to be understood that various alternatives, equivalents and modifications are possible. Therefore, the scope of the invention should not be limited to the embodiments described, and should instead be determined by the following claims and their full breadth of equivalents.

What is claimed is:

1. An integrated circuit comprising:
    a plurality of pads arranged along a peripheral region of the integrated circuit;
    a plurality of programmable logic elements arranged in a plurality of rows and columns in an interior portion of the integrated circuit, the programmable logic elements configurable to perform user-defined functions;
    a plurality of I/O banks arranged along at least part of the peripheral region of the integrated circuit, each I/O bank comprising at least one I/O section, each I/O section comprising:
        a plurality of I/O register blocks, each I/O register block having an input coupled to one of the plurality of pads; and
        a delay block having an input coupled to one of the plurality of pads and an output coupled to a clock input for each of the plurality of I/O register blocks;
    a plurality of programmable interconnect lines, configurable to couple the plurality of programmable logic elements to the plurality of I/O banks; and
    a delay-locked loop coupled to calibrate a delay through the delay block.

2. The integrated circuit of claim 1 wherein the delay-locked loop calibrates the delay through the delay block in a manner that compensates for process, voltage, and temperature variations.

3. The integrated circuit of claim 2 wherein each of the plurality of I/O register blocks comprises:
    a first flip-flop having a data input coupled to one of the plurality of pads and a clock input coupled to the output of the delay block; and
    a second flip-flop having a data input coupled to the data input of the first flip-flop and a clock input coupled to the output of the delay block.

4. The integrated circuit of claim 3 wherein the first flip-flop is coupled to be clocked by rising edges of a signal at the output of the delay block and the second flip-flop is coupled to be clocked by falling edges of a signal at the output of the delay block.

5. The integrated circuit of claim 1 further comprising a plurality of memory arrays arranged among the plurality of programmable logic elements.

6. The integrated circuit of claim 5 wherein the plurality of programmable interconnect lines are further configurable to couple the plurality of memory arrays to the plurality of programmable logic elements.

7. The integrated circuit of claim 5 wherein the integrated circuit is a field-programmable gate array.

8. An integrated circuit comprising:
    a plurality of programmable logic elements;
    a plurality of register blocks, each having a data input coupled to receive a DQ signal;
    a delay block having an input coupled to receive a DQS signal, a control input coupled to receive a control signal, and an output coupled to provide a delayed DQS signal to each of the plurality of register blocks;
    a delay-locked loop coupled to receive a clock signal and provide the control signal; and
    a plurality of logic interconnect lines configurable to couple the plurality of programmable logic elements to the plurality of register blocks.

9. The integrated circuit of claim 8 wherein the DQS signal is delayed by a duration that is calibrated by the delay locked loop.

10. The integrated circuit of claim 9 wherein the DQS signal is delayed by a duration that is compensated for process, voltage, and temperature variations.

11. The integrated circuit of claim 8 wherein the programmable logic elements are configurable to perform user-defined functions.

12. The integrated circuit of claim 8 wherein each register block comprises at least a first flip-flop and a second flip-flop.

13. The integrated circuit of claim 12 wherein the first flip-flop is coupled to be clocked by rising edges of the delayed DQS signal and the second flip-flop is coupled to be clocked by falling edges of the delayed DQS signal.

14. The integrated circuit of claim 8 further comprising a plurality of memory arrays coupled to the plurality of programmable logic elements.

15. The integrated circuit of claim 14 wherein the integrated circuit is a field-programmable gate array.

16. An integrated circuit comprising:
a plurality of programmable logic elements, configurable to perform user-defined functions;
a plurality of memory arrays coupled to the plurality of programmable logic elements;
a plurality of I/O register blocks, each having a data input coupled to receive a DQ signal;
a delay circuit having a DQS input coupled to receive a DQS signal, a control input coupled to receive a control signal, and a delayed DQS output coupled to provide a delayed DQS signal to each of the plurality of I/O register blocks;
a plurality of logic interconnect lines configurable to couple the plurality of programmable logic elements to the plurality of I/O register blocks and to the plurality of memory arrays; and
a delay-locked loop coupled to receive a clock signal and provide the control signal to the delay circuit,
wherein the control signal calibrates the delay of the DQS signal though the delay circuit.

17. The integrated circuit of claim 16 wherein the delay locked-loop calibrates the delay of the DQS signal through the delay circuit in a manner that compensates for process, voltage, and temperature variations.

18. The integrated circuit of claim 16 wherein each the plurality of I/O register blocks comprises:
a first flip-flop having a data input coupled to receive a DQ signal and a clock input coupled to receive the delayed DQS signal; and
a second flip-flop having a data input coupled to receive the DQ signal and a clock input coupled to receive the delayed DQS signal.

19. The integrated circuit of claim 18 wherein the DQS signal is delayed by a duration that approximately corresponds to a 90 degree phase shift.

20. An integrated circuit comprising:
a plurality of I/O sections, each comprising:
    a DQS input circuit responsive to a DQS signal and providing an output signal;
    a double-data rate input register block comprising:
        a first register having a data input responsive to a DQ signal and a clock input responsive to a first edge of the output signal from the DQS input circuit; and
        a second register having a data input responsive to the DQ signal and a clock input responsive to a second edge of the output signal from the DQS input circuit; and
        a programmable delay element that provides a phase delay between the DQ signal at the input of the first register and the output signal from the DQS input circuit.

21. The integrated circuit of claim 20 wherein each of the I/O sections further comprises:
a plurality of double-data rate input register blocks, each comprising:
    a first register having a data input responsive to a DQ signal and a clock input responsive to a first edge of the output signal from the DQS input circuit; and
    a second register having a data input responsive to the DQ signal and a clock input responsive to a second edge of the output signal from the DQS input circuit.

22. The integrated circuit of claim 20 further comprising:
a plurality of programmable logic elements, configurable to perform user-defined logic functions; and
a plurality of logic interconnect lines configurable to couple the plurality of programmable logic elements to the plurality of I/O sections.

23. The integrated circuit of claim 20 further comprising:
a plurality of programmable logic elements, configurable to perform user-defined logic functions;
a plurality of memory arrays; and
a plurality of logic interconnect lines configurable to couple the plurality of programmable logic elements to the plurality of I/O sections and to the plurality of memory arrays.

24. The integrated circuit of claim 20 wherein the phase delay is programmably adjusted by a control circuit comprising an up/down counter.

25. The integrated circuit of claim 24 wherein the control circuit programmably adjusts the phase delay between the DQ signal at the input of the first register and the output signal from the DQS input circuit to compensate for process variations.

26. The integrated circuit of claim 24 wherein the control circuit programmably adjusts the phase delay between the DQ signal at the input of the first register and the signal at the output of the DQS input circuit to compensate for process, voltage, and temperature variations.

27. The integrated circuit of claim 20 wherein the double-data rate input register block further comprises a third register and a fourth register.

28. The integrated circuit of claim 20 wherein the integrated circuit is a field programmable gate array.

29. An integrated circuit comprising:
a plurality of I/O sections, each comprising:
    a DQS input circuit responsive to a DQS signal;
    a double-data rate input register block having an input responsive to a DQ signal and a clock input responsive to a signal at an output of the DQS input circuit, the double-data rate register comprising:
    four registers including:
        a first register having a data input;
        a second register having a data input coupled to the data input of the first register; and
        a delay circuit to provide a relative phase delay between a signal at the input of the first register and the signal at the output of the DQS input circuit.

30. The integrated circuit of claim 29 wherein the first register is triggered by a first edge of the signal at the output of the DQS input circuit and the second register is triggered by a second edge of the signal at the output of the DQS input circuit.

31. The integrated circuit of claim 29 wherein the first register is clocked by a first edge of the signal at the output of the DQS input circuit and the second register is clocked by a second edge of the signal at the output of the DQS input circuit.

32. The integrated circuit of claim 31 further comprising:
a plurality of programmable logic elements, configurable to perform user-defined logic functions; and
a plurality of logic interconnect lines configurable to couple the plurality of programmable logic elements to the plurality of I/O sections.

33. The integrated circuit of claim 31 further comprising:
a plurality of programmable logic elements, configurable to perform user-defined logic functions;
a plurality of memory arrays; and a plurality of logic interconnect lines configurable to couple the plurality of programmable logic elements to the plurality of I/O sections and to the plurality of memory arrays.

34. The integrated circuit of claim 29 further comprising a control circuit including an up/down counter that provides a count to adjust the relative delay.

35. The integrated circuit of claim 34 wherein the control circuit adjusts the relative delay between the DQ signal at the input of the first register and the signal at the output of the DQS input circuit to compensate for process variations.

36. An integrated circuit comprising:
a plurality of programmable logic elements, configurable to perform user-defined logic functions;
a plurality of I/O sections, each comprising:
a DQS input circuit coupled to a first pad to receive a DQS signal;
a double-data rate input register block comprising:
four registers including:
a first register having a data input responsive to a DQ signal and clocked by a first edge of a signal at an output of the DQS input circuit; and
a second register having a data input responsive to the DQ signal and clocked by a second edge of the signal at the output of the DQS input circuit; and
a programmable delay element that programmably provides a relative phase delay between the DQ signal at the data input of the first register and the signal at the output of the DQS input circuit; and
a plurality of logic interconnect lines configurable to couple the plurality of programmable logic elements to the plurality of I/O sections.

37. The integrated circuit of claim 36 wherein the relative phase delay is programmably adjusted by a control circuit, the control circuit comprising an up/down counter.

38. The integrated circuit of claim 37 wherein the control circuit programmably adjusts the relative phase delay between the DQ signal at the input of the first register and the signal at the output of the DQS input circuit to compensate for process variations.

39. An integrated circuit comprising:
a plurality of I/O sections, each comprising:
a DQS input circuit responsive to a DQS signal;
a double-data rate input register block having an input responsive to a DQ signal and a clock input responsive to a signal at an output of the DQS input circuit, the double-data rate register comprising:
a first register having a data input;
a second register having a data input coupled to the data input of the first register; and
a plurality of phase delay circuits to provide a phase delay between a signal at the input of the first register and the signal at the output of the DQS input circuit.

40. The integrated circuit of claim 39 wherein the first register is triggered by a first edge of the signal at the output of the DQS input circuit and the second register is triggered by a second edge of the signal at the output of the DQS input circuit.

41. The integrated circuit of claim 39 wherein the first register is clocked by a first edge of the signal at the output of the DQS input circuit and the second register is clocked by a second edge of the signal at the output of the DQS input circuit.

42. The integrated circuit of claim 41 further comprising:
a plurality of programmable logic elements, configurable to perform user-defined logic functions; and
a plurality of logic interconnect lines configurable to couple the plurality of programmable logic elements to the plurality of I/O sections.

43. The integrated circuit of claim 41 further comprising:
a plurality of programmable logic elements, configurable to perform user-defined logic functions;
a plurality of memory arrays; and
a plurality of logic interconnect lines configurable to couple the plurality of programmable logic elements to the plurality of I/O sections and to the plurality of memory arrays.

44. The integrated circuit of claim 39 further comprising a control circuit including an up/down counter to provide a count, wherein the count is incremented and decremented to adjust the phase delay.

45. The integrated circuit of claim 44 wherein the control circuit controls the phase delay between the DQ signal at the input of the first register and the signal at the output of the DQS input circuit to compensate for process variations.

46. The integrated circuit of claim 44 wherein the control circuit controls the phase delay between the DQ signal at the input of the first register and the signal at the output of the DQS input circuit to compensate for process, temperature, and supply variations.

47. The integrated circuit of claim 39 wherein the double-data rate input register block further comprises a third register and a fourth register.

* * * * *